(12) United States Patent
Yu et al.

(10) Patent No.: US 9,502,271 B2
(45) Date of Patent: Nov. 22, 2016

(54) WARPAGE CONTROL FOR FLEXIBLE SUBSTRATES

(71) Applicant: Taiwan Semiconductor Manufacturing Company, Ltd., Hsin-Chu (TW)

(72) Inventors: Chen-Hua Yu, Hsin-Chu (TW); Shih Ting Lin, Taipei (TW); Jing-Cheng Lin, Chu Tung Zhen (TW); Shang-Yun Hou, Jubei (TW); Szu Wei Lu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/310,377

(22) Filed: Jun. 20, 2014

(65) Prior Publication Data

US 2014/0302642 A1    Oct. 9, 2014

Related U.S. Application Data

(62) Division of application No. 13/782,109, filed on Mar. 1, 2013, now abandoned.

(60) Provisional application No. 61/726,824, filed on Nov. 15, 2012.

(51) Int. Cl.
*H01L 21/56* (2006.01)
*H01L 23/00* (2006.01)
(Continued)

(52) U.S. Cl.
CPC ............ *H01L 21/561* (2013.01); *H01L 21/56* (2013.01); *H01L 23/4985* (2013.01); *H01L 23/5387* (2013.01); *H01L 23/562* (2013.01); *H01L 24/81* (2013.01); *H01L 24/83* (2013.01); *H01L 24/92* (2013.01); *H01L 21/563* (2013.01); *H01L 24/05* (2013.01); *H01L 24/13* (2013.01); *H01L 24/16* (2013.01); *H01L 24/32* (2013.01); *H01L 2224/0401* (2013.01); *H01L 2224/058* (2013.01); *H01L 2224/05609* (2013.01); *H01L 2224/05611* (2013.01); *H01L 2224/05624* (2013.01); *H01L 2224/05644* (2013.01); *H01L 2224/05647* (2013.01); *H01L 2224/05794* (2013.01); *H01L 2224/131* (2013.01); *H01L 2224/133* (2013.01);
(Continued)

(58) Field of Classification Search
CPC ..... H01L 24/16; H01L 21/56; H01L 21/563; H01L 23/4985; H01L 23/5387
USPC .......................................... 438/108, 126, 127
See application file for complete search history.

(56) References Cited

U.S. PATENT DOCUMENTS 6,121,689 A * 9/2000 Capote et al. ................. 257/783
6,163,462 A   12/2000 Buck
(Continued)

FOREIGN PATENT DOCUMENTS

JP    2009276629      11/2009
JP    2012146823 A    8/2012
(Continued)

*Primary Examiner* — Phat X Cao
(74) *Attorney, Agent, or Firm* — Slater Matsil, LLP

(57) ABSTRACT

Flexible structures and method of providing a flexible structure are disclosed. In some embodiments, a method of providing a flexible structure includes: providing a flex substrate having a device bonded to a first side of the flex substrate; and attaching a rigid layer to a second side of the flex substrate opposite the first side using an adhesive layer.

20 Claims, 3 Drawing Sheets

(51) Int. Cl.
  *H01L 23/538* (2006.01)
  *H01L 23/498* (2006.01)
(52) U.S. Cl.
  CPC ......... *H01L 2224/13109* (2013.01); *H01L 2224/13111* (2013.01); *H01L 2224/13144* (2013.01); *H01L 2224/13147* (2013.01); *H01L 2224/13294* (2013.01); *H01L 2224/16* (2013.01); *H01L 2224/32225* (2013.01); *H01L 2224/73204* (2013.01); *H01L 2224/81007* (2013.01); *H01L 2224/81192* (2013.01); *H01L 2224/81193* (2013.01); *H01L 2224/81409* (2013.01); *H01L 2224/81411* (2013.01); *H01L 2224/81424* (2013.01); *H01L 2224/81444* (2013.01); *H01L 2224/81447* (2013.01); *H01L 2224/81815* (2013.01); *H01L 2224/831* (2013.01); *H01L 2224/83007* (2013.01); *H01L 2224/92125* (2013.01); *H01L 2924/01322* (2013.01); *H01L 2924/3511* (2013.01)

(56) References Cited

U.S. PATENT DOCUMENTS

| | | | |
|---|---|---|---|
| 6,633,078 B2* | 10/2003 | Hamaguchi et al. | 257/686 |
| 7,169,685 B2* | 1/2007 | Connell et al. | 438/460 |
| 2004/0155358 A1 | 8/2004 | Iijima | |
| 2006/0043603 A1* | 3/2006 | Ranade et al. | 257/778 |
| 2006/0056161 A1 | 3/2006 | Shin et al. | |
| 2006/0208365 A1 | 9/2006 | Shen et al. | |
| 2006/0255442 A1 | 11/2006 | Gaynes et al. | |
| 2007/0063324 A1* | 3/2007 | Mishiro et al. | 257/678 |
| 2009/0152714 A1 | 6/2009 | Yamagishi et al. | |
| 2009/0285580 A1 | 11/2009 | Yasuda et al. | |
| 2010/0327437 A1 | 12/2010 | Nakahama | |
| 2011/0309491 A1 | 12/2011 | Thorne et al. | |

FOREIGN PATENT DOCUMENTS

| | | |
|---|---|---|
| KR | 10-2006-0023775 | 3/2006 |
| TW | M353605 | 3/2009 |

* cited by examiner

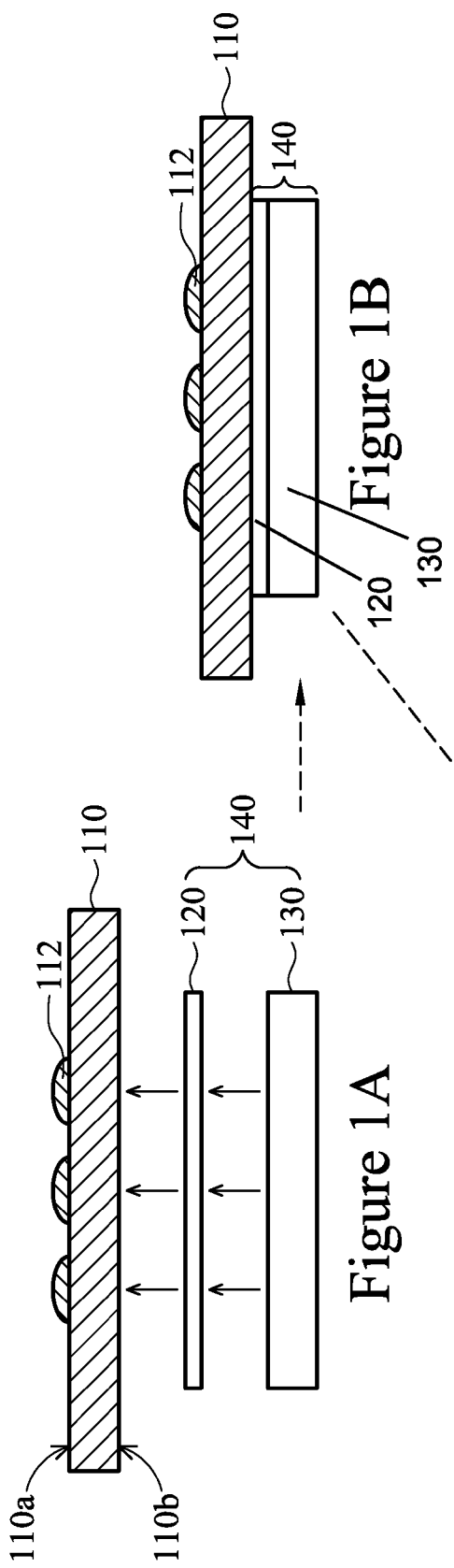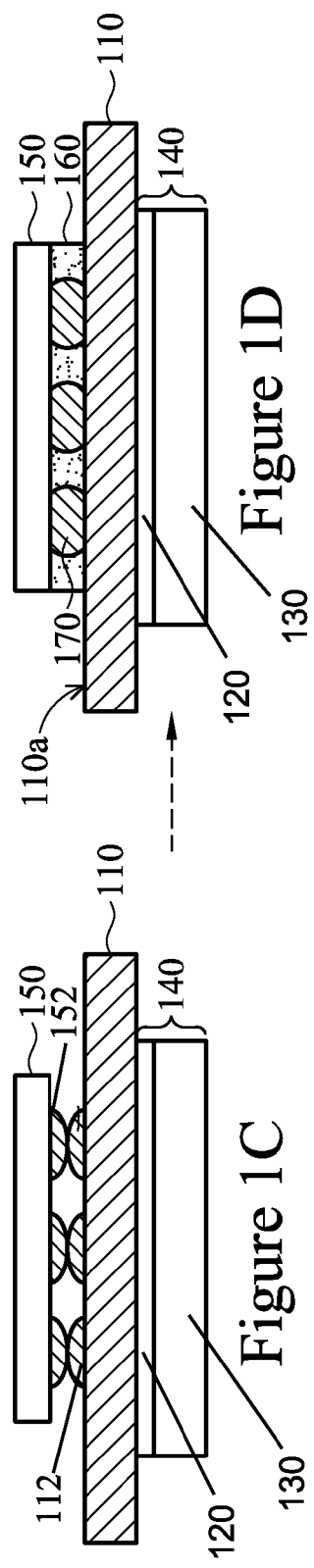

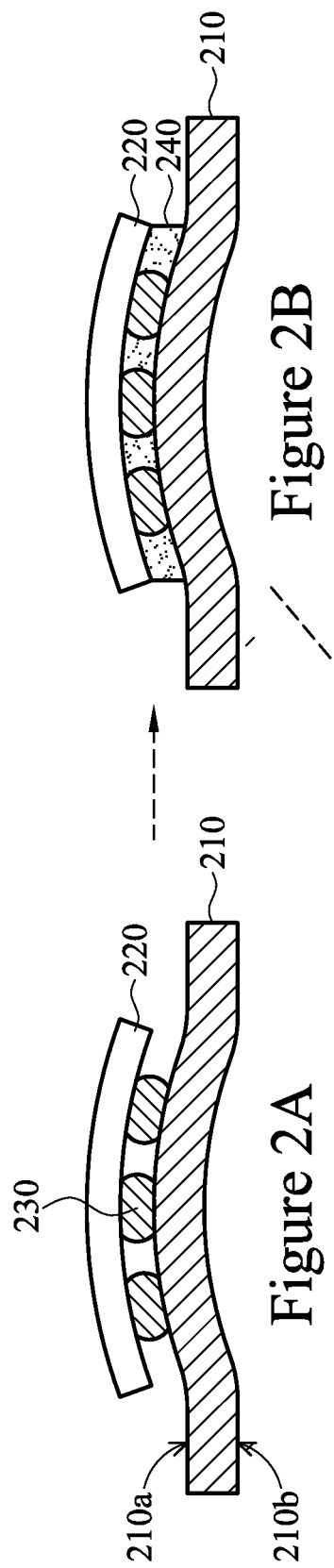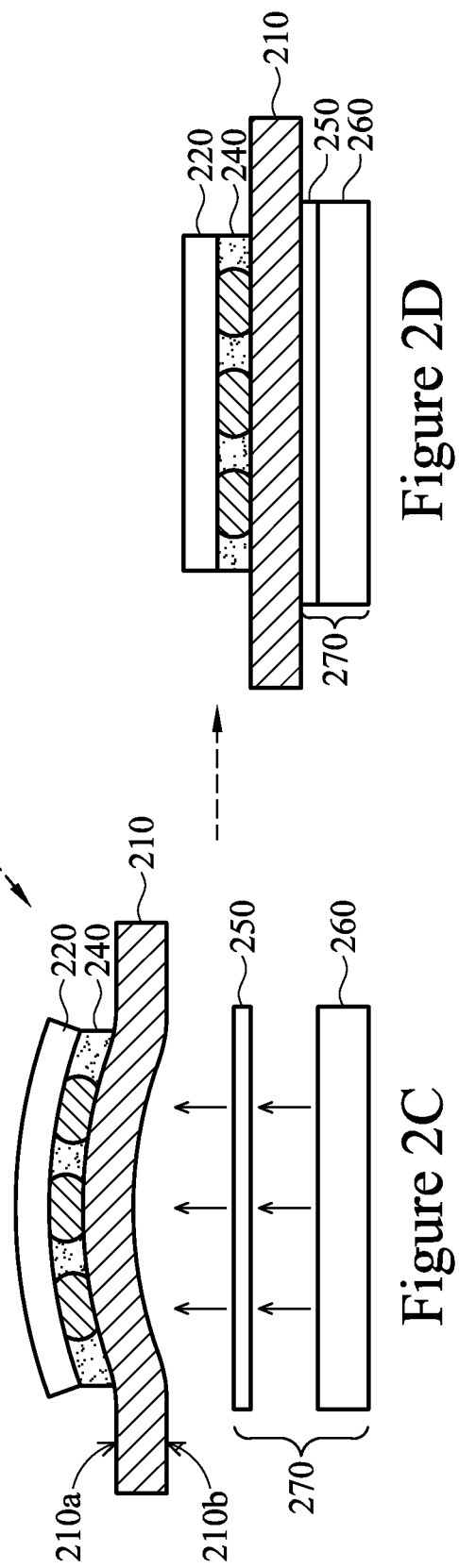

WARPAGE CONTROL FOR FLEXIBLE SUBSTRATES

PRIORITY CLAIM AND CROSS-REFERENCE

This application is a divisional of U.S. patent application Ser. No. 13/782,109, entitled "Warpage Control for Flexible Substrates," filed on Mar. 1, 2013, which application claims the benefit of U.S. Provisional Application Ser. No. 61/726,824, filed on Nov. 15, 2012, entitled "Warpage Control for Flexible Substrates," which applications are hereby incorporated herein by reference.

BACKGROUND

A flexible substrate (also referred herein to as a "flex" substrate) is a substrate that provides for flexible movement. Flex substrates provide advantages over non-flexible substrates in applications where a device may be subjected to movements such as bending, twisting or the like. Semiconductor devices, integrated circuits or the like can be electrically coupled to flex substrates. Differences in material properties between a flex substrate and a device being coupled to the flex substrate can degrade electrical connections between the device and the flex substrate. For example, differences between coefficients of thermal expansion for a flex substrate and for a device electrically coupled to the flex substrate can cause strain on the electrical connections between the device and the flex substrate.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 1A-1D illustrate cross-sectional views of intermediate stages of forming a warpage control device according to an embodiment;

FIGS. 2A-2D illustrate cross-sectional views of intermediate stages of forming a warpage control device according to another embodiment.

DETAILED DESCRIPTION OF ILLUSTRATIVE EMBODIMENTS

Figure 3A:
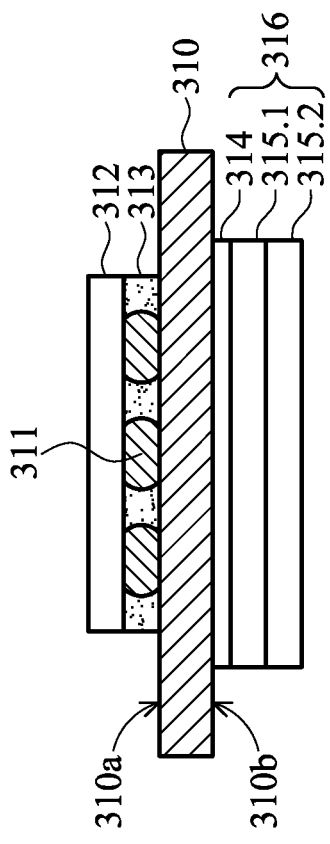
FIGS. 3A-3B illustrate cross-sectional views of various warpage control devices according to various embodiments.

The making and using of the embodiments are discussed in detail below. It should be appreciated, however, that the present disclosure provides many applicable inventive concepts that can be embodied in a wide variety of specific contexts. The specific embodiments discussed are merely illustrative of specific ways to make and use the invention, and do not limit the scope of the invention.

In general terms, embodiments provide a warpage control device that limits warpage or bow of a flex substrate. The warpage control device may be applied either prior to or following a reflow process wherein a device may be electrically coupled to the flex substrate. The warpage control device may provide support for the flex substrate to aid in maintaining the integrity of electrical connections between a device and a flex substrate throughout various manufacturing, fabrication and/or testing processes. The warpage control device may also provide support for the flex substrate to aid in maintaining the integrity of electrical connections between a device and a flex substrate in various operating environments, conditions or applications.

FIGS. 1A-1D illustrate cross-sectional views of intermediate stages of forming a warpage control device 140 according to an embodiment. As illustrated in FIGS. 1A-1B, a flex substrate 110 may include a first side 110a and a second side 110b. In an embodiment, a plurality of solder bumps and/or bonding pads 112 may be formed on the first side 110a of the flex substrate. An adhesive layer 120 and a rigid layer 130, which together may comprise the warpage control device 140, may be attached to the second side 110b of the flex substrate 110. In an embodiment, the warpage control device 140 may be formed on an area of the second side 110b that may be opposite the plurality of solder bumps and/or bonding pads 112 formed on the first side 110a of the flex substrate 110.

In various embodiments, the flex substrate 110 may comprise polymer films, such as polyethylene terephthalate, kapton, polyimide or the like, flexible plastic substrates, transparent conductive polyester films or other like materials. In various embodiments, the adhesive layer 120 may comprise epoxy, a polymer, glue, an adhesive agent or the like disposed between the rigid layer 130 and the flex substrate 110. In various embodiments, the rigid layer 130 may comprise a metal, a plastic, a polymer, a semiconductor material, a quartz, a ceramic or other material that may provide a rigid or semi-rigid support to the flex substrate 110. For example, a material may be chosen for the rigid layer 130 that may have a higher bulk modulus as compared to that of the flex substrate 110. In an embodiment, the rigid layer 130 may comprise a plurality of layers (not shown).

As illustrated in FIGS. 1A-1B, the warpage control device 140 may, in an embodiment, be attached to the flex substrate 110 before electrically coupling another device (discussed below) to the flex substrate 110. Placing the warpage control device 140 on the flex substrate 110 before electrically coupling the other device (discussed below) to the flex substrate 110 may aid in minimizing warpage or bow of the flex substrate 110 during the electrical coupling of the other device (discussed below) and/or subsequent manufacturing processes.

The methods for attaching the warpage control device 140 on the flex substrate 110 may vary. In one embodiment, for example, the adhesive layer 120 may first be formed on the second side 110b of flex substrate 110 and then the rigid layer 130 may be applied to the adhesive layer 120. In various embodiments, the adhesive layer 120 may be formed on the second side 110b of the flex substrate 110 using processes such as, for example, lamination, spraying, dipping, brushing or the like. In such embodiments, the rigid layer 130 may, for example, be pressed, fused, laminated, affixed or applied onto the adhesive layer 120 to form the warpage control device 140.

In another embodiment, for example, the adhesive layer 120 may first be formed on the rigid layer 130 and then the combined adhesive layer 120 and rigid layer 130 may be attached to the second side 120b of the flex substrate 110 to form the warpage control device 140. In various embodiments, the adhesive layer 120 may be formed on the rigid layer 130 using processes such as, for example, lamination, spraying, dipping, brushing or the like. In such embodiments, the rigid layer 130 and the adhesive layer 120, together, may be pressed, fused, laminated, affixed or applied onto the second side 110b of the flex substrate 110 to form the warpage control device 140.

As illustrated in FIGS. 1C-1D, a device 150 may be coupled to the flex substrate 110 following attachment of the warpage control device 140 thereon. As shown in FIG. 1C, the device 150 may include solder bumps or bonding pads 152 formed thereon. The device 150 may be aligned with and placed upon corresponding solder bumps or bonding pads 112 on the flex substrate 110. In various embodiments, the device 150 may be a packaged semiconductor device, an interposer, a die, a wafer, another flex substrate, a non-flexible substrate or other like material. In various embodiments, the solder bumps or bonding pads 152 on the device may comprise metals including, but not limited to, a eutectic alloy such as AlCu, AlGe or a low-melting point metal layer such as In, Au, Sn, Cu, lead free solder, solder paste or other like material.

As shown in FIG. 1D, a reflow process may be performed to couple the device 150 to the flex substrate 110 through a plurality of electrical connections 170. During the reflow process, the warpage control device 140 may aid in minimizing warpage or bow of the flex substrate 110. Also shown in FIG. 1D, a molding underfill 160 may be formed between the device 150 and the first side 110a of the flex substrate. The molding underfill 160 may further aid in minimizing warpage or bow of the flex substrate 110 during subsequent manufacturing processes.

In various embodiments, the solder bumps and/or bonding pads 112 on the first side 110a of the flex substrate 110 may comprise metals including, but not limited to, a eutectic alloy such as AlCu, AlGe or a low-melting point metal layer such as In, Au, Sn, Cu or other like material.

FIGS. 2A-2D illustrate various intermediate stages of forming a warpage control device in accordance with another embodiment. As shown in FIGS. 2A-2B, a flex substrate 210 may include a first side 210a and a second side 210b. A device 220 may be electrically coupled to the flex substrate 210 through a plurality of connections 230 on the first side 210a of the flex substrate 210. FIG. 2B illustrates the configuration of FIG. 2A after a molding underfill 240 may be formed between the device 220 and the first side 210a of the flex substrate 210.

As shown in FIGS. 2C-2D, a warpage control device 270 may be attached on the second side 210b of the flex substrate 210. The warpage control device 270 may include an adhesive layer 250 and a rigid layer 260. In an embodiment, the warpage control device 270 may be formed on an area of the second side 210b that may be opposite the device 220 formed on the first side 210a of the flex substrate 210. In comparison to the embodiment illustrated in FIGS. 1A-1D in which the warpage control device 140 is attached to the flex substrate 110 before coupling the device 150 to the flex substrate 110, the embodiment as illustrated in FIGS. 2A-2D provides for attaching the warpage control device 270 to the flex substrate 210 after coupling the device 220 to the flex substrate 210.

The methods for attaching the warpage control device 270 on the flex substrate 210 may vary. In one embodiment, for example, the adhesive layer 250 may first be formed on the second side 210b of flex substrate 110 and then the rigid layer 260 may be attached to the adhesive layer 250. In various embodiments, the adhesive layer 250 may be formed on the second side 210b of the flex substrate 210 using processes such as, for example, lamination, spraying, dipping, brushing or the like. In such embodiments, the rigid layer 260 may be pressed, fused, laminated, affixed or applied onto the adhesive layer 250 to form the warpage control device 270.

In another embodiment, for example, the adhesive layer 250 may first be formed on the rigid layer 260 and then the combined adhesive layer 250 and rigid layer 260 may be attached to the second side 120b of the flex substrate 210 to form the warpage control device 270. In various embodiments, the adhesive layer 250 may be formed on the rigid layer 260 using processes such as, for example, lamination, spraying, dipping, brushing or the like. In such embodiments, the rigid layer 260 and the adhesive layer 250, together, may be pressed, laminated, fused, affixed or applied onto the second side 210b of the flex substrate 210 to form the warpage control device 270.

As illustrated in FIGS. 2A-2D, the device 220 may be coupled to the flex substrate 210 before the warpage control device 270 may be formed on the flex substrate 210. The order of forming a warpage control device on a flex substrate may depend on manufacturing processes and/or device types that may be coupled to the flex substrate on the opposite side of the flex substrate. The embodiments as shown in FIGS. 1A-1D and 2A-2D are provided to illustrate that the order of forming a warpage control device on a flex substrate may be varied, as determined by design and/or manufacturing processes involving the flex substrate.

Figure 3B:
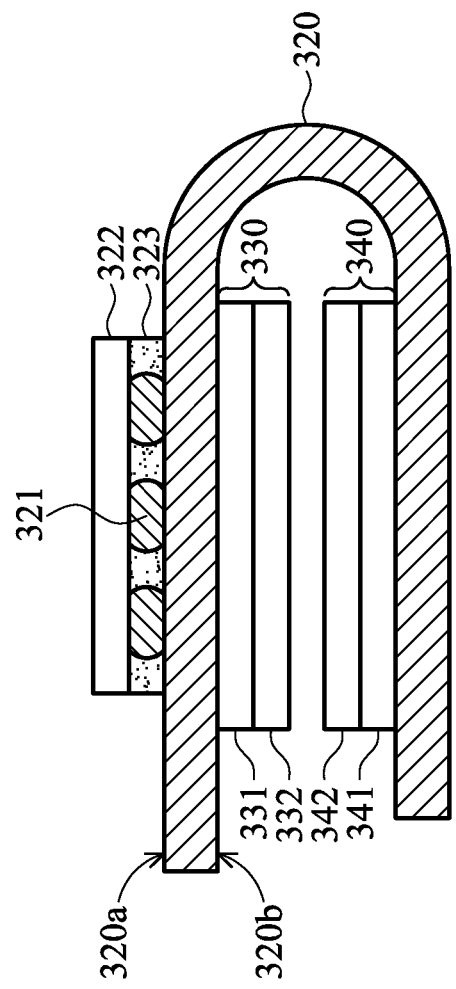

The present disclosure provides for other warpage control device configurations. FIGS. 3A-3B illustrate cross-sectional views of various warpage control devices according to various embodiments. As shown in FIG. 3, a flex substrate 310 may include a first side 310a and a second side 310b. A plurality of electrical connections 311 may be formed on the first side 310a between a device 312 and the flex substrate 310. A molding underfill 313 may be formed between the device 312 and the first side 310a of the flex substrate 310. A warpage control device 316 may be attached to an area of the second side 310b that may be opposite the device 312 formed on the first side 310a of the flex substrate 310. The warpage control device 316 may include an adhesive layer 314 and a plurality of layers, shown here as a first layer 315.1 and a second layer 315.2. In various embodiments, the plurality of layers may be rigid layers, semi-rigid layers, heat-sinks or the like. The plurality of layers may be attached together using similar methods similar attaching methods as those discussed herein.

FIG. 3B illustrates a cross-sectional view of a plurality of warpage control devices on a flex substrate 320 according to an embodiment. As shown in FIG. 3B, the flex substrate 320 may include a first side 320a and a second side 320b. A plurality of electrical connections 321 may be formed between a device 322 and the flex substrate 320 on the first side 320a of the flex substrate 320. A molding underfill 323 may be formed between the device 322 and the first side 320a of the flex substrate 320.

A first warpage control device 330, which may include a first adhesive layer 331 and a first rigid layer 332, may be attached to the second side 320b of the flex substrate 320. The first warpage control device 330 may be formed in an area of the second side 320b that may be opposite the device 322 formed on the first side 320a of the flex substrate 320.

As shown in FIG. 3B, the flex substrate 320 may be bent in a manner to double-back on itself. In an embodiment a second warpage control device 340, which may include a second adhesive layer 341 and a second rigid layer 342, may also be attached to the second side 320b of the flex substrate. The second warpage control device 340 may be formed in an area of the second side 320b that may approximately align with the first warpage control device 330 when the flex substrate 320 is bent backwards on itself as shown in FIG. 3B.

The second warpage control device 340 may provide additional support to aid in maintaining the integrity of the electrical connections 321 between the device 322 and the flex substrate 320 through applications where one or more forces may be applied that may press the flex substrate 320 together. Such applications may include, for example, touch screen applications, touch pad applications, press-key applications or other applications. In an embodiment, the second warpage control device in a similar area, but may be located on the first side 320a of the flex substrate.

In an embodiment, a method is provided. The method may include providing a flex substrate having a plurality of electrical connections formed on a first side of the flex substrate; and attaching an adhesive layer and a rigid layer to a second side of the flex substrate, wherein the adhesive layer and the rigid layer are attached to an area of the second side of the flex substrate opposing the one or more electrical connections on the first side of the flex substrate.

In another embodiment, another method is provided. The method may include attaching a device to one or more electrical connections on a first side of a flex substrate; and attaching an adhesive layer and a rigid layer on a second side of the flex substrate, wherein the adhesive layer is attached to an area of the second side of the flex substrate opposing the one or more electrical connections.

In an embodiment, an apparatus is provided. The apparatus may comprise a flex substrate having a first side and a second side; one or more electrical connections on the first side of the flex substrate; a first rigid layer on the second side of the flex substrate, wherein the first rigid layer is positioned in an area of the second side opposing the one or more electrical connections on the first side of the flex substrate; and a first adhesive layer between the first rigid layer and the second side of the flex substrate.

Although the present embodiments and their advantages have been described in detail, it should be understood that various changes, substitutions and alterations can be made herein without departing from the spirit and scope of the disclosure as defined by the appended claims. For example, it will be readily understood by those skilled in the art that the structures and ordering of steps as described above may be varied while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method, comprising:
providing a flex substrate having a device bonded to a first side of a bowed region of the flex substrate, the bowed region and the device having substantially similar curvatures; and
after the providing, attaching a rigid layer to a second side of the bowed region opposite the first side using a non-conductive adhesive layer, the rigid layer substantially eliminating the curvatures of the bowed region and the device; and
attaching an additional rigid layer to an additional region of the flex substrate on a same side of the flex substrate as the rigid layer, wherein the additional rigid layer is disposed under the rigid layer.

2. The method of claim 1, wherein the attaching the rigid layer comprises attaching the rigid layer to a region of the second side of the bowed region opposing the device on the first side of the bowed region.

3. The method of claim 1, wherein the attaching the rigid layer to the second side of the bowed region comprises:
attaching the non-conductive adhesive layer to the second side of the bowed region; and
adhering the rigid layer to the non-conductive adhesive layer attached to the second side of the bowed region.

4. The method of claim 1, wherein the attaching the rigid layer to the second side of the bowed region comprises:
forming the non-conductive adhesive layer on the rigid layer; and
attaching the rigid layer having the non-conductive adhesive layer formed thereon to the second side of the bowed region.

5. The method of claim 1, wherein the attaching the rigid layer to the second side of the flex substrate comprises at least one of laminating, spraying, dipping, and brushing the non-conductive adhesive layer to the rigid layer or to the second side of the bowed region.

6. The method of claim 1, wherein the providing the flex substrate having the device bonded to the first side of the bowed region comprises:
coupling the device to the first side of the bowed region using a plurality of electrical connections; and
forming a molding underfill between the device and the first side of the bowed region, the molding underfill encapsulating the plurality of electrical connections.

7. The method of claim 6, wherein the coupling the device to the first side of the bowed region using the plurality of electrical connections comprises a reflow process.

8. The method of claim 1, wherein a width of the non-conductive adhesive layer is greater than a width of the device.

9. A method, comprising:
providing a flex substrate having a first edge region, a second edge region opposite the first edge region, and a curved region having a first curvature disposed between the first edge region and the second edge region, the flex substrate having a device having a second curvature bonded to the curved region of the flex substrate at a first side of the flex substrate, the first curvature substantially equal to the second curvature;
attaching a warpage control device to at least the curved region of the flex substrate at a second side of the flex substrate opposite the first side, wherein the warpage control device is attached to continuously contact an entire lateral extent of the curved region of the flex substrate, the warpage control device substantially eliminating the first curvature of the curved region and the second curvature of the device; and
attaching an additional warpage control device to an additional region of the flex substrate at the second side of the flex substrate, wherein the additional warpage control device is disposed under the warpage control device.

10. The method of claim 9, wherein the warpage control device comprises a rigid layer and an adhesive layer, and wherein the attaching the warpage control device comprises adhering the rigid layer to at least the curved region at the second side of the flex substrate using the adhesive layer.

11. The method of claim 10, wherein the rigid layer comprises a plurality of layers.

12. The method of claim 9, wherein the attaching the warpage control device comprises bonding the warpage control device to the curved region of the flex substrate and to a portion of the first edge region proximate the curved region and a portion of the second edge region proximate the curved region.

13. The method of claim 9, wherein the attaching the warpage control device comprises at least one of a laminating process, a spraying process, a dipping process, and a brushing process.

14. The method of claim 9, wherein a bulk modulus of the warpage control device is larger than a bulk modulus of the flex substrate.

15. The method of claim 9, wherein the flex substrate comprises a plurality of polymer films.

16. A method, comprising:
providing a flex substrate having a plurality of electrical connections formed on a first side of the flex substrate;
attaching a device to the plurality of electrical connections on the first side of the flex substrate to form a bowed flex substrate comprising a first edge region, a second edge region opposite the first edge region, and a curved region disposed between the first edge region and the second edge region, wherein the device is attached to the curved region of the bowed flex substrate and follows a curvature of the curved region;
after attaching the device, attaching a rigid layer to a second side of the bowed flex substrate opposite the first side using an adhesive layer, wherein the adhesive layer is attached to continuously contact an entire lateral extent of the curved region of the bowed flex substrate, the rigid layer substantially eliminating the curvature of the curved region; and
attaching an additional rigid layer to an additional region of the bowed flex substrate on a same side of the bowed flex substrate as the rigid layer, wherein the additional rigid layer is disposed under the rigid layer.

17. The method of claim 16, wherein the attaching the rigid layer comprises attaching the rigid layer to a region of the second side of the bowed flex substrate opposing the device.

18. The method of claim 16, wherein the attaching the rigid layer to the second side of the bowed flex substrate comprises:
attaching the adhesive layer to the second side of the bowed flex substrate; and
adhering the rigid layer to the adhesive layer attached to the second side of the bowed flex substrate.

19. The method of claim 16, wherein the attaching the rigid layer to the second side of the bowed flex substrate comprises:
forming the adhesive layer on the rigid layer; and
attaching the rigid layer having the adhesive layer formed thereon to the second side of the bowed flex substrate.

20. The method of claim 16, wherein the attaching the device to the plurality of electrical connections comprises forming a molding underfill between the device and the first side of the flex substrate, the molding underfill encapsulating the plurality of electrical connections.

* * * * *